United States Patent
Knorr et al.

(10) Patent No.: US 7,157,373 B2
(45) Date of Patent: Jan. 2, 2007

(54) SIDEWALL SEALING OF POROUS DIELECTRIC MATERIALS

(75) Inventors: Andreas Knorr, Austin, TX (US); Bernd Kastenmeier, Austin, TX (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 300 days.

(21) Appl. No.: 10/732,963

(22) Filed: Dec. 11, 2003

(65) Prior Publication Data

US 2005/0127515 A1 Jun. 16, 2005

(51) Int. Cl.
*H01L 21/44* (2006.01)

(52) U.S. Cl. .................. 438/687; 438/629

(58) Field of Classification Search ............ None
See application file for complete search history.

(56) References Cited

U.S. PATENT DOCUMENTS

| | | | |
|---|---|---|---|
| 5,741,626 A * | 4/1998 | Jain et al. ............. | 430/314 |
| 6,180,518 B1 | 1/2001 | Layadi et al. | |
| 6,444,557 B1 * | 9/2002 | Biolsi et al. ........... | 438/597 |
| 6,482,733 B1 | 11/2002 | Raaijmakers et al. | |
| 6,518,166 B1 | 2/2003 | Chen et al. | |
| 6,528,409 B1 | 3/2003 | Lopatin et al. | |
| 6,585,811 B1 | 7/2003 | Palmans et al. | |
| 6,586,334 B1 | 7/2003 | Jiang | |
| 6,593,220 B1 * | 7/2003 | Yu et al. ................ | 438/612 |
| 6,689,686 B1 | 2/2004 | Guldi et al. | |
| 2001/0051420 A1 | 12/2001 | Besser et al. | |
| 2001/0054769 A1 * | 12/2001 | Raaijmakers et al. ...... | 257/758 |
| 2002/0055256 A1 | 5/2002 | Jiang | |
| 2003/0001282 A1 | 1/2003 | Maynen et al. | |
| 2003/0143839 A1 | 7/2003 | Raaijmakers et al. | |

FOREIGN PATENT DOCUMENTS

| | | |
|---|---|---|
| JP | 1 096 562 A2 | 5/2001 |
| JP | 2001-196455 | 7/2001 |

OTHER PUBLICATIONS

Wolf et al., Silicon Processing for the VLSI Era, 2000, vol. I, Lattice Press, 719-727, 791-795.*
Caluwaerts, R., et al., Post Patterning Meso Porosity Creation: A Potential Solution for Pore Sealing, International Interconnect Technology Conference, Jun. 2-4, 2003, pp. 242-244, Omnipress, Madison, WI.
Hu, B.K. et al., "Spin-On Barrier for Pore-Sealing on 2.2 Porous Ultra Low-K Material", Advanced Metallization Conference (AMC) 2003, Oct. 21-23, 2003, Montreal, Canada.
Mourier, T., et al., Porous low k pore sealing process study for 65 nm and below technologies, International Interconnect Technology Conference, Jun. 2-4, 2003, pp. 245-247, Omnipress, Madison, WI.

(Continued)

*Primary Examiner*—Leonardo Andujar
(74) *Attorney, Agent, or Firm*—Slater & Matsil, L.L.P.

(57) ABSTRACT

A semiconductor device and method of manufacture thereof. A porous dielectric material is deposited over a workpiece. The porous dielectric material is patterned, and a photosensitive material is spun-on over the patterned porous dielectric material. A portion of the photosensitive material is formed over, and/or soaks into sidewalls of the porous dielectric material pattern, forming a barrier region of photosensitive material. The photosensitive material is developed, leaving the sidewalls of the porous dielectric material pattern sealed by the barrier region of photosensitive material. A liner is deposited over the porous dielectric material, and a conductive material such as copper is used to fill the pattern in the porous dielectric material. Diffusion of copper into the pores of the porous dielectric material is prevented by the barrier region.

18 Claims, 5 Drawing Sheets

OTHER PUBLICATIONS

Park, Jae-Eun et al., Mass-Productive Ultra-Low Temperature ALD $SiO_2$ Process Promising for Sub-90nm Memory and Logic Devices, International Electron Devices Meeting Technical Digest, Dec. 8-11, 2002, San Francisco, CA.

Hu, B.K. et al., "Spin-On Barrier for Pore-Sealing on 2.2 Porous Ultra Low-K Material," Advanced Metallization Conference (AMC) 2003, Oct. 21-23, 2003, pp. 421-427, Montreal, Canada, Materials Research Society, Warrendale, Pennsylvania.

Klaus, J.W., et al., "Atomic Layer Desposition of $Sio_2$ Using Catalyzed And Uncatalyzed Self-Limiting Surface Reactions," Surface Review and Letters, vol. 6, Nos. 3 & 4, Jun. 1999, pp. 435-448, XP-000972688, World Scientific Publishing Company.

* cited by examiner

SIDEWALL SEALING OF POROUS DIELECTRIC MATERIALS

TECHNICAL FIELD

The present invention relates generally to semiconductor devices, and more particularly to the fabrication of semiconductor devices utilizing porous dielectric materials.

BACKGROUND

In the evolution of integrated circuits in semiconductor technology, there has been a trend towards device scaling. Scaling or reducing the size increases circuit performance, primarily by increasing circuit speed, and also increases the functional complexity of the integrated circuits. The number of devices per chip has increased throughout the years. When integrated circuits contained only a small number of devices per chip, the devices could be easily interconnected in a single level. However, the need to accommodate more devices and increased circuit speed has led to the use of multi-level or multi-layer interconnects.

In a multi-level interconnection system, the area needed by the interconnect lines is shared among two or more levels, which increases the active device fractional area, resulting in increased functional chip density. Implementing a multilevel interconnect process to a fabrication scheme increases the complexity of the manufacturing process. Typically, the active devices (e.g., the transistors, diodes, capacitors and other components) are manufactured in the lower layers of wafer processing. After the active devices are processed, the multilevel interconnects are usually formed.

As semiconductor devices continue to shrink, various aspects of multilevel interconnect processes are challenged. The propagation delay of integrated circuits becomes limited by the large RC time delay of interconnection lines when minimum feature size is decreased below about 1 μm, for example. Therefore, the industry is tending towards the use of different materials and processes to improve multilevel interconnect implementations. In particular, the change in the conductive materials and insulating materials used in multilevel interconnect schemes is proving challenging and requires a change in a number of processing parameters.

In the past, interconnect lines were made of aluminum. Now there is a trend towards the use of copper for interconnect lines because copper has a higher conductivity than aluminum. For many years, the insulating material used to isolate conductive lines from one another was silicon dioxide. Silicon dioxide has a dielectric constant (k) of approximately 4.0 or greater, where the dielectric constant value k is based on a scale where 1.0 represents the dielectric constant of vacuum. However, now there is a trend in the semiconductor industry towards the use of low-dielectric constant materials (e.g., having a dielectric constant k of 3.6 or less) for insulating materials.

Copper is a desirable conductive line material because it has a higher conductivity than aluminum. However, the RC (resistance/capacitance) time delay of copper conductive lines can be problematic, so low-dielectric constant materials are used to reduce the capacitive coupling and reduce the RC time delay between interconnect lines. However, copper easily migrates into low-dielectric constant materials, which can cause shorting and create device failures. To prevent this, liners are typically used to prevent the migration of copper into the adjacent low-dielectric constant material.

Some low-dielectric constant materials are porous, having a plurality of pores spaced throughout the dielectric material. Such porous low-dielectric constant materials may be deposited by chemical vapor deposition (CVD), or may be spun on in liquid solution and subsequently cured by heating to remove the solvent. Porous low-dielectric constant materials are advantageous in that they have a dielectric constant of 3.0 or less. Examples of such porous low-dielectric constant materials include porous SiLK™ and porous silicon carbonated oxide, as examples. A porogen may be included in the porous low-dielectric constant materials to cause the formation of the pores.

While porous low-dielectric constant materials are beneficial because of their low dielectric constant properties, they are disadvantageous in that the liners typically used as a diffusion barrier before the copper is deposited, such as Ta and/or TaN based materials, TiN, WN or tungsten carbonitride, do not line the inner surfaces of the pores of the porous low-dielectric constant materials on the sidewalls and other surfaces of the low-dielectric constant materials. Thus, copper comes into contact with the inner surfaces of the pores and can migrate through the low-dielectric constant material, causing shorts and device failures. Moisture can also become trapped in the unlined pores, causing oxidation of the copper and/or making the copper diffuse easier into the low-dielectric constant material, which is also a problem.

In addition, during advanced metal barrier deposition processes such as CVD and atomic layer deposition (ALD), precursor or reactant species can penetrate deep into interconnected pore structures of the low-dielectric constant materials. This can cause undesirable contamination, increased leakage, and reliability issues.

Therefore, what is needed in the art is a method of sealing the sidewalls of porous low-dielectric constant materials.

SUMMARY OF THE INVENTION

These and other problems are generally solved or circumvented, and technical advantages are generally achieved, by preferred embodiments of the present invention, which provide a selective method of sealing sidewalls of porous dielectric materials in advanced low-k/copper applications. A photosensitive material is deposited over a patterned porous dielectric material, and the photosensitive material soaks into the pores along the sidewalls of the pattern of the porous dielectric material. The photosensitive material is developed, leaving a barrier region of photosensitive material disposed within the sidewalls of the porous dielectric material pattern.

In accordance with a preferred embodiment of the present invention, a method of fabricating a semiconductor device includes providing a workpiece, depositing a porous dielectric material over the workpiece, and forming a pattern in the porous dielectric material, the pattern comprising sidewalls. A photosensitive material is deposited over the porous dielectric material, wherein the photosensitive material forms a barrier region of photosensitive material within the sidewalls of the pattern in the porous dielectric material, over the sidewalls of the pattern in the porous dielectric material, or both. The photosensitive material is then exposed and developed.

In accordance with another preferred embodiment of the present invention, a semiconductor device includes a workpiece, and a porous dielectric material disposed over the workpiece, the porous dielectric material comprising a pattern, the pattern comprising sidewalls. A barrier region of photosensitive material is disposed within, over, or within and over the porous dielectric material sidewalls.

Advantages of embodiments of the present invention include providing a method of forming a barrier region along sidewalls of damascene structures in porous dielectric materials. The barrier region within the sidewalls prevents copper and CVD or ALD precursors or reactant species from diffusing into pinholes that may be formed in a liner deposited prior to filling the damascene patterns with copper. Embodiments of the invention allow the use of a conformal liner deposited by ALD or CVD, rather than by physical vapor deposition (PVD). The method and structure results in fewer device failures and increased yields. Patterns with substantially vertical sidewalls may be manufactured using embodiments of the present invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
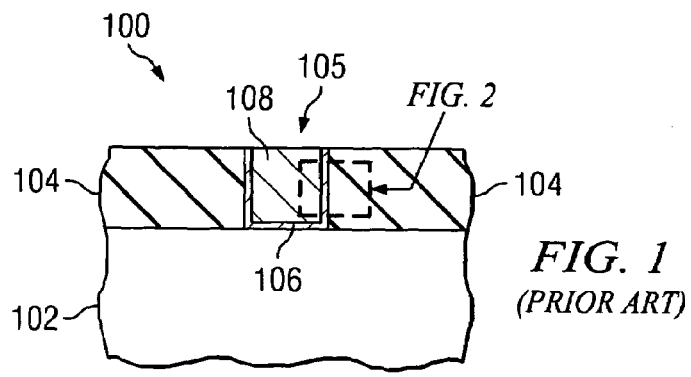
FIGS. 1 and 2 show cross-sectional views of a prior art semiconductor device, in which copper diffuses into low dielectric constant material insulators and damascene structures.

FIG. 1 shows a prior art semiconductor device 100 that includes a workpiece 102 having a porous low-k material 104 deposited thereon. A pattern 105 has been formed in the porous low-k material 104. The pattern 105 may comprise a pattern for conductive lines or vias, as examples. A liner 106 comprising a conductive material, for example, is formed over the porous low-k material 104, and the pattern 105 is then filled with copper 108 using an electroless or electroplating technique, for example. Excess copper 108 and liner 106 are then removed from the top surface of the porous low-k material 104 using a chemical-mechanical polish (CMP) process, for example.

Figure 2:
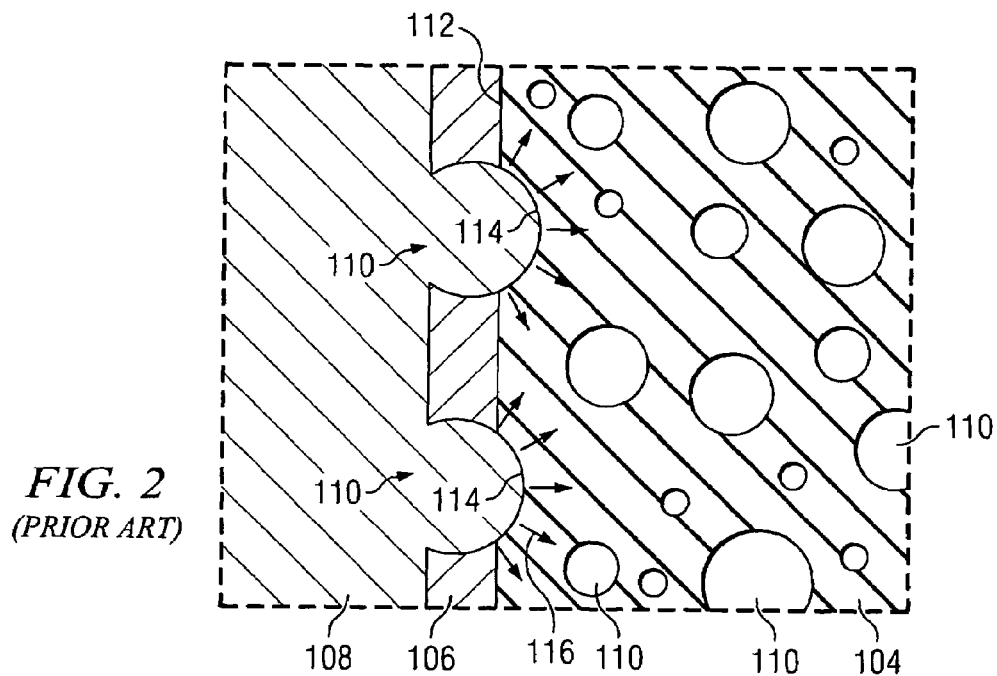

A problem with the prior art structure shown in FIG. 1 is illustrated in the more detailed view of the sidewalls 112 of the patterns 105 in FIG. 2. Because the porous low-k material 104 comprises pores throughout the material, the interior surfaces 114 of the pores 110 along the sidewalls 112 are not lined by the liner 106, as shown. Therefore, when copper 108 is deposited over the liner 106 in the pattern 105, the copper 108 fills the pores 110. This is problematic because copper diffuses (e.g., at 116) easily into some insulating materials, in particular into porous low-k materials 104. Such diffusion 116 of the copper 108 into the porous low-k material 104 can result in shorts and device failures, for example.

Figure 3:
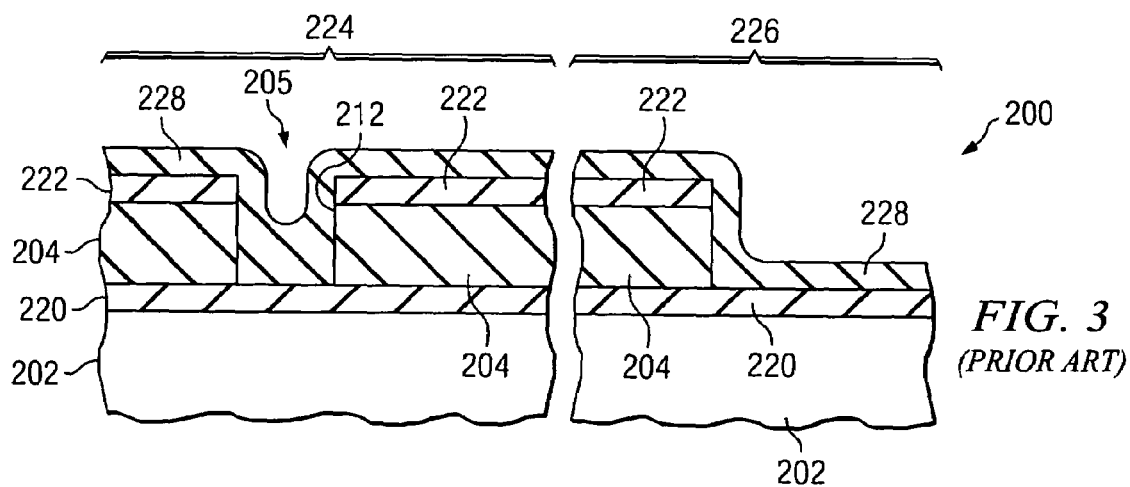
FIGS. 3 and 4 show a prior art method of treating sidewalls of porous low-k dielectric materials to prevent diffusion of subsequently deposited copper into the porous low-k material.

A prior art method of treating sidewalls 212 of patterns 205 in a semiconductor device 200 to prevent diffusion of copper into porous low-k materials will next be described, with reference to FIGS. 3 and 4. A first etch stop layer 220 is formed over a workpiece 202, and a porous low-k material 204 is formed over the first etch stop layer 220. A second etch stop layer 222 is formed over the porous low-k material 204. The second etch stop layer 222 and porous low-k material 204 are patterned using lithography techniques to form a pattern 205 for conductive lines or vias. A patterned region 224 and an edge region 226 of the semiconductor device 200 are shown in FIG. 3.

A thin spin-on coating 228 is deposited over the patterned second etch stop layer 222 and porous low-k material 204, as shown. The thin spin-on coating 228 is preferably thin to ensure that the desired amount of the thin spin-on coating 228 will be removed in a later process. The thin spin-on coating 228 comprises a dielectric material and is adapted to cover the sidewalls 212 of the porous low-k material 204.

Figure 4:
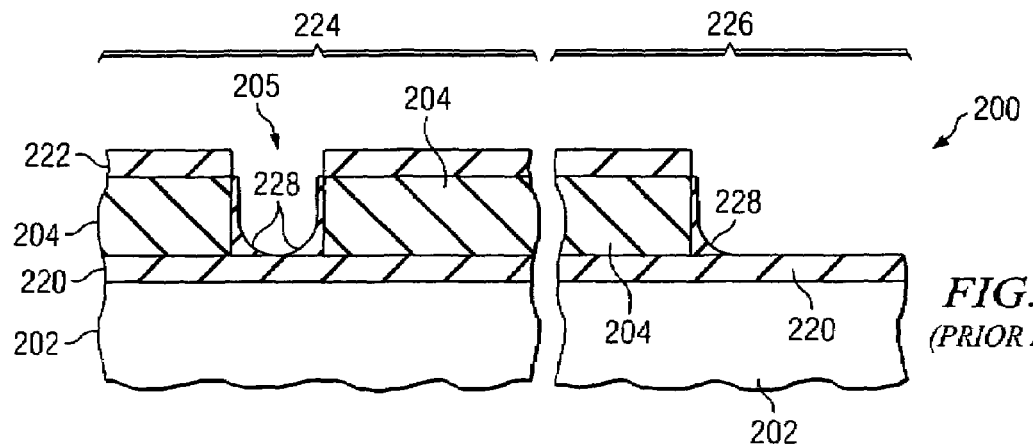

The semiconductor device 200 is then heated to evaporate the thin spin-on coating 228 from the top surface and sidewalls 212 of the patterns 205, as shown in FIG. 4. However, a problem with this method is that a portion of the thin spin-on coating 228 tends to remain, for example, in the lower region of the patterns 205 at the inside bottom corners of trenches, as shown at 228. The spin-on coating has a tendency to form puddles that are difficult to remove, especially in the smaller structures. This can be particularly problematic when the pattern 205 comprises a narrow via, which may comprise a height that is greater than the width, thus making it difficult to remove all of the material 228 in the lower regions of the pattern 205.

Leaving a portion of the thin spin-on coating 228 remaining in the lower region of the patterns 205 is particularly problematic, for example, when electrical contact needs to be made to an underlying feature in the workpiece 202, not shown, as is common in multi-level interconnects. The portion of the thin spin-on coating 228 remaining residing within the bottom portion of the pattern 205 may prevent electrical contact with underlying conductive regions, or may prevent an adequate amount of electrical contact being made with underlying conductive regions in the workpiece 202.

Therefore, what is needed in the art is a method of sealing a sidewall of a pattern in a porous low-k material that prevents the diffusion of copper into the porous low-k material, yet wherein all of the material used to treat the sidewalls is removed from within the features.

The present invention will be described with respect to preferred embodiments in a specific context, namely a semiconductor device having a porous low-dielectric constant material as an insulating layer. Embodiments of the invention may also be applied, however, to other porous materials used in semiconductor manufacturing, for example.

FIGS. 5 through 10 illustrate cross-sectional views of a semiconductor device 300 at various stages of manufacturing in accordance with a preferred embodiment of the present invention. A workpiece 302 is provided. The workpiece 302 may include a semiconductor substrate comprising silicon or other semiconductor materials covered by an insulating layer, for example. The workpiece 302 may also include other active components or circuits formed in the front end of line (FEOL), not shown. The workpiece 302 may comprise silicon oxide over single-crystal silicon, for example. The workpiece 302 may include other conductive layers or other semiconductor elements, e.g., transistors, diodes, etc. Compound semiconductors, GaAs, InP, Si/Ge, or SiC, as examples, may be used in place of silicon.

Figure 5:
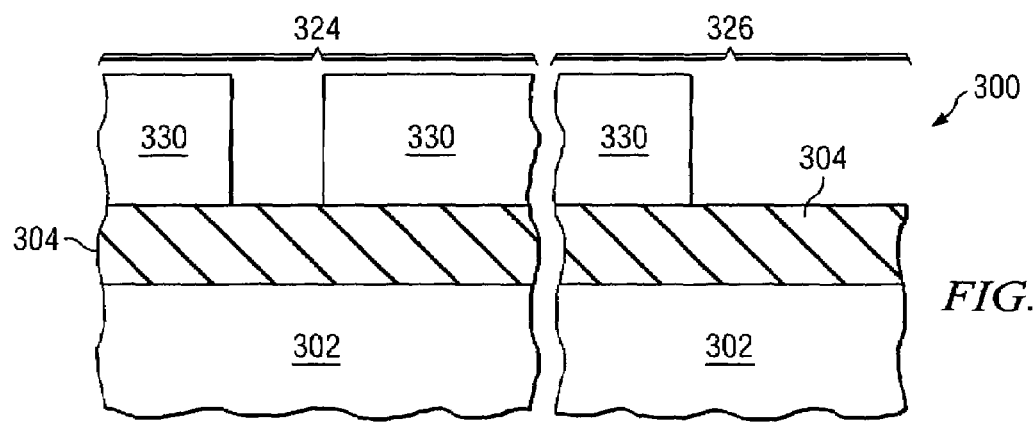
FIGS. 5 through 10 show cross-sectional views of a preferred embodiment in accordance with the present invention, wherein a photosensitive layer is deposited and developed to form a barrier region on the sidewalls of features formed in a porous dielectric material.

A porous dielectric material 304 is deposited over the workpiece 302, as shown in FIG. 5. The porous dielectric material 304 preferably comprises a porous low-k material having a dielectric constant (k) value of 3.0 or lower. For example, the porous dielectric material 304 may comprise a material having a k value of about 3.0 or less with a porogen introduced in order form pores and lower the dielectric constant to 2.7 or less, and more preferably about 2.5 or less, e.g. 1.8 or 1.9. Typically, the more pores 310 formed in the material, the lower the dielectric constant k of the dielectric material will be. The porous dielectric material 304 may comprise a thickness of about 800 Å to 4000 Å, for example. Alternatively, the porous dielectric material 304 may comprise other thicknesses. The porous dielectric material 304 may comprise porous methylsilsesquioxane (MSQ), porous inorganic materials, porous CVD materials, porous organic materials, other non-low-k dielectric materials, or combinations thereof, as examples.

A photoresist 330 is deposited over the porous dielectric material 304. The photoresist 330 is patterned using a lithography mask, as an example, although the photoresist 330 may alternatively be directly patterned, and the photoresist 330 is developed to remove portions of the photoresist 330, as shown. The workpiece 302 may comprise patterned regions 324 and edge regions 326.

Figure 6:
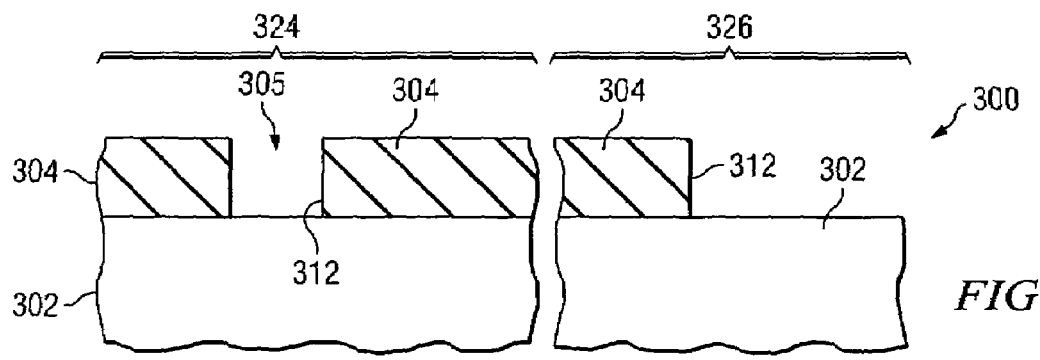
Figure 12C:
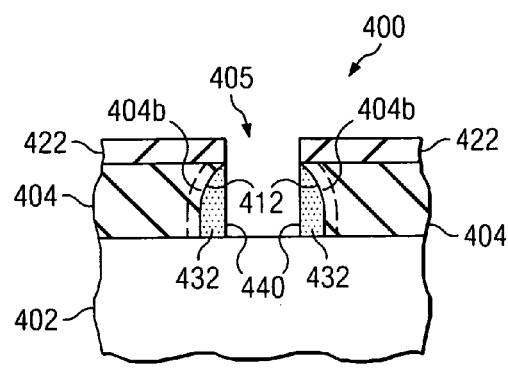

The pattern from the photoresist 330 is transferred to the porous dielectric material 304, as shown in FIG. 6. For example, the porous dielectric material 304 may be patterned using the photoresist 330 as a mask. Patterns 305 are formed in the patterned region 324. The patterns 305 comprise sidewalls 312, and sidewalls 312 may also be formed in the edge regions 326 of the semiconductor device 300. Pores 310 along the sidewalls 312 may have exposed interior surfaces 314, as shown. A term "sidewall" is used herein to refer to a surface of the porous dielectric material 304. For example, a sidewall may comprise a vertical surface 312, 412, and 512 as shown in FIGS. 6 through 10, 12a and 13, respectively. A sidewall may also comprise a horizontal surface 512a as shown in the dual damascene structure in FIG. 13. A sidewall in accordance with embodiments of the present invention may alternatively comprise an angled surface; for example, the lower part of a dual damascene pattern such as the one shown in FIG. 13 may have inwardly sloping sidewalls, which is a common shape for vias (not shown) For example, a via may be wider at the top and narrower at the bottom. Alternatively, the lower part of a damascene pattern may comprise outwardly sloping sidewalls, as shown in FIGS. 12b and 12c, to be described further herein.

Figure 7:
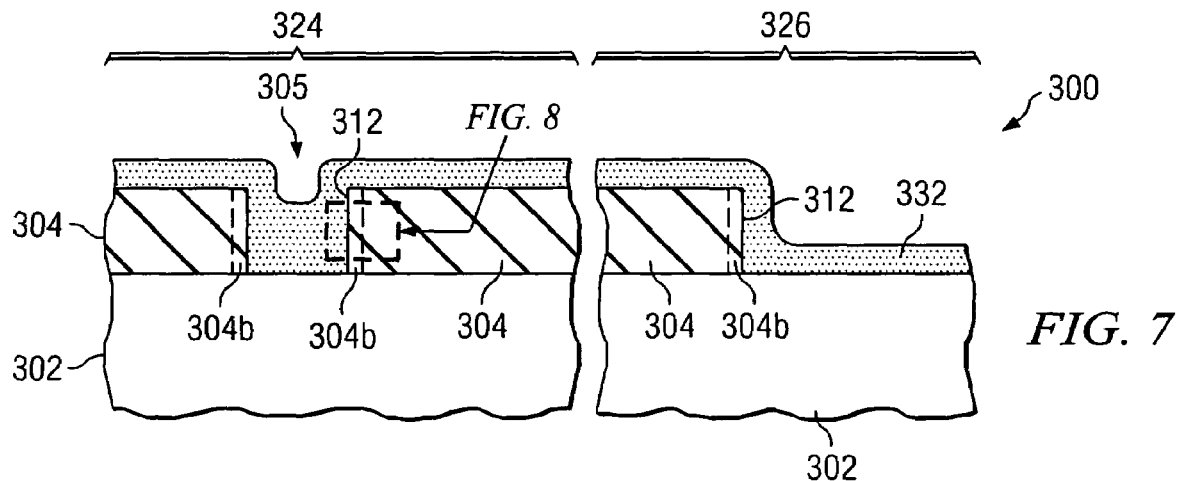

Next, in accordance with a preferred embodiment of the present invention, a photosensitive layer 332 is formed over the patterned porous dielectric material 304 and exposed surfaces of the workpiece 302, as shown in FIG. 7. The photosensitive layer 332 preferably comprises a photosensitive polyimide, and may alternatively comprise a photosensitive organic material, or a photosensitive inorganic material, as examples. The photosensitive layer 332 may comprise a MSQ material, an inorganic material, a CVD material, an organic material, or a non-low-k dielectric material, as examples. In one embodiment, the photosensitive layer 332 comprises a benzocyclobutane (BCB)-type material, as an example. The photosensitive layer 332 preferably comprises a thickness of about 2000 Å or less, for example. The photosensitive layer 332 preferably has a high thermal stability, e.g., is stable up to about 400° C., as an example. The photosensitive layer 332 may in one embodiment comprise a photoresist having a high thermal stability, for example.

In one embodiment, the photosensitive layer 332 comprises a spin-on dielectric that is chemically compatible with the material of the porous dielectric material 304. Preferably, but not necessarily, the photosensitive material is less porous than the dielectric material. For example, if the porous dielectric material 304 comprises porous MSQ, then the photosensitive layer 332 preferably comprises a photosensitive MSQ that is less porous than the porous MSQ of the porous dielectric material 304. In this embodiment, the porous dielectric material 304 may have a dielectric constant of 2.5 or lower and the photosensitive layer 332 may have a dielectric constant of 2.7 or greater, as examples. Likewise, if the porous dielectric material 304 comprises a porous inorganic material, a porous CVD material, a porous organic material, or a non-low-k dielectric material, then the photosensitive material 332 preferably comprises an inorganic material less porous than the porous inorganic material of the porous dielectric material 304, a CVD material less porous than the porous CVD material of the porous dielectric material 304, a CVD or an organic material less porous than the porous organic material of the porous dielectric material 304, or a non-low-k dielectric material less porous than the porous non-low-k dielectric material of the porous dielectric material 304, respectively.

Figure 8:
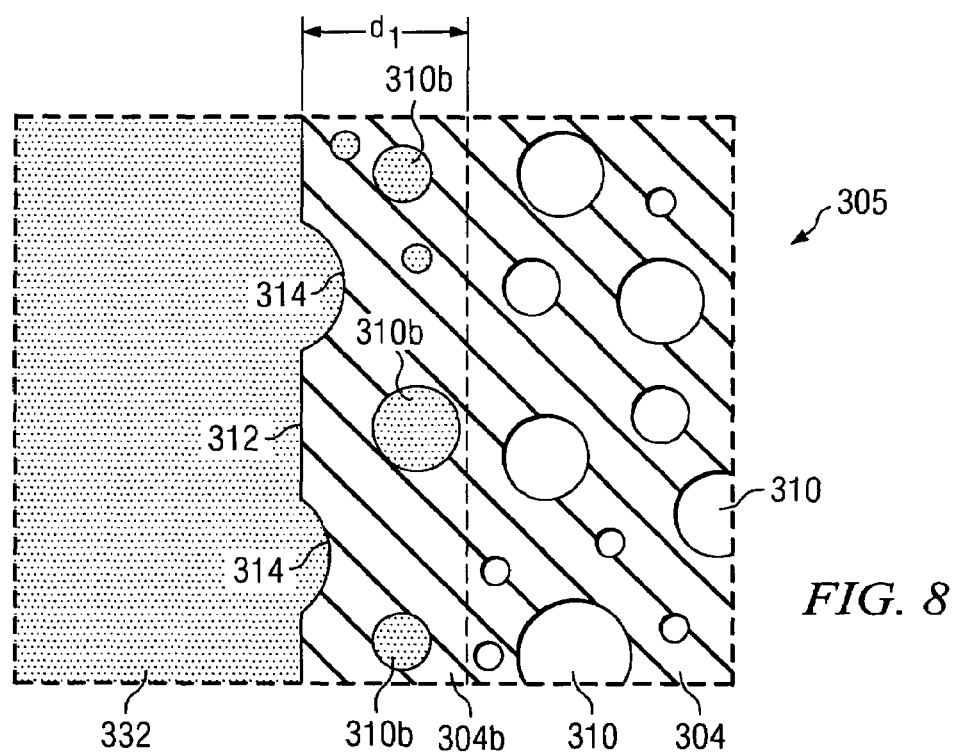

The photosensitive layer 332 is adapted to soak or seep into the sidewalls 312 of the porous dielectric material 304, as shown in FIG. 7, upon the deposition of the photosensitive layer 332. The photosensitive layer 332 in one embodiment soaks into the pores 310b of the porous dielectric material 304, as shown in FIG. 8, which is a more detailed view of the sidewall region 312 of the patterns 305 of FIG. 7. The photosensitive layer 332 is adapted to enter into the sidewalls 312 by a distance $d_1$, which may comprise a thickness of one or two pores, for example. In one embodiment, the distance $d_1$ may comprise about 50 Å or less, as an example. Thus, the porous dielectric material 304b proximate the sidewalls 312 of the patterns 305 are substantially soaked with the photosensitive layer 332 material into a predetermined distance $d_1$ within the sidewalls 312.

Figure 9:
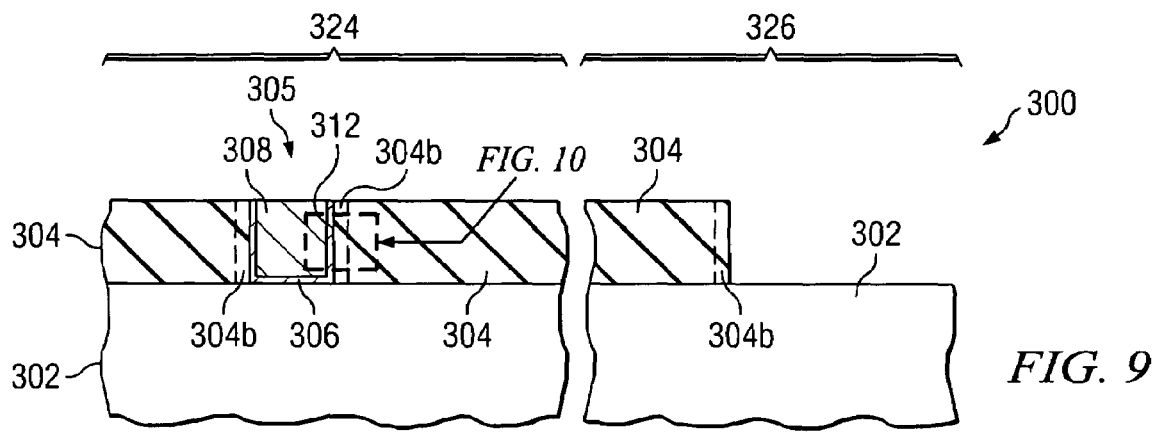

The semiconductor device 300 is then exposed to a lithography flood exposure in order to develop the photosensitive layer 332. The flood exposure preferably comprises ultraviolet (UV) light or deep UV (DUV) at an i-line or other wavelength or another light source. For example, the wavelength may comprise 365 nm, 248 nm, or 193 nm, as examples. A lithography mask may be used during the exposure, for example. The flood exposure preferably comprises an energy level sufficient to expose excess material of the photosensitive layer 332 from the sidewalls 312, for example. The developing of the photosensitive layer 332 preferably results in the removal of the photosensitive layer 332 from the sidewalls 312 of the patterns 305, as shown in FIG. 9. Advantageously, substantially all of the photosensitive layer 332 is removed from the sidewalls 312 in accordance with embodiments of the present invention.

A liner 306 may then be deposited over the features 305, and the liner 306 may then be filled with a conductive material 308 such as copper. The liner 306 may comprise Ta and/or TaN based materials, TiN, WN, tungsten carbo-nitride, or combinations thereof, as examples. The conductive material 308 may comprise copper or a copper alloy deposited by electroplating or electro-less plating, or other deposition methods, for examples. Excess copper 308 and liner 306 are then removed from the top surface of the porous dielectric material 304 using a chemical-mechanical polish (CMP) process, for example. CVD and ALD processes may be used to deposit the liner 306 and conductive material 308, as examples.

Figure 10:
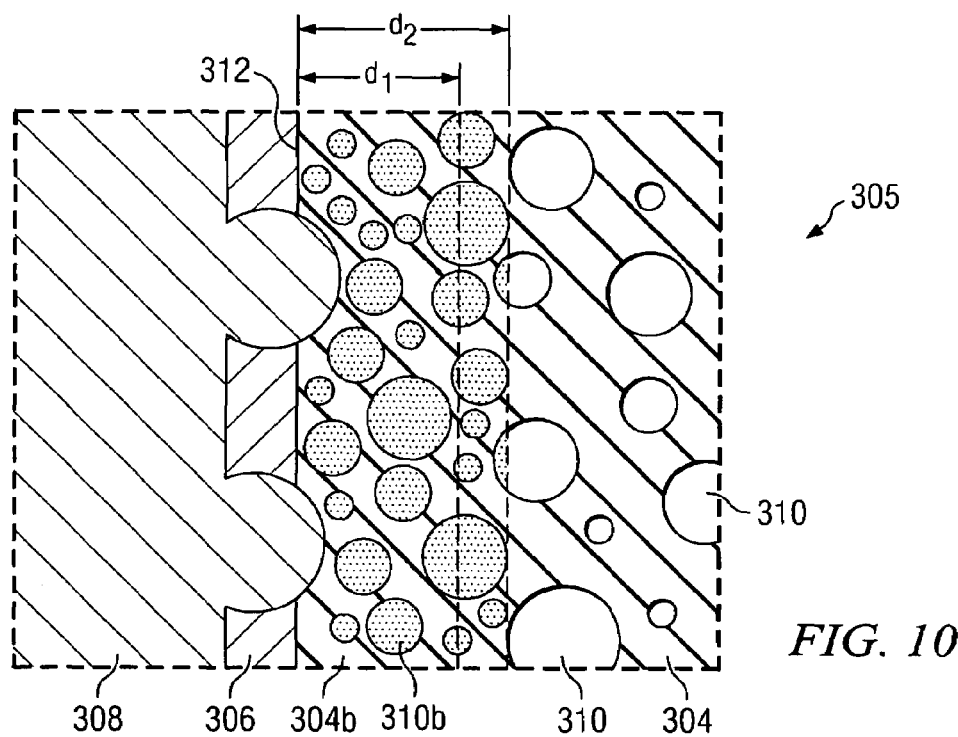

FIG. 10 shows a more detailed view of the sidewall 312 region of FIG. 9. The barrier region 304b of the low-k dielectric 304 functions as a barrier, preventing the copper 308 from diffusing into the low-k material 304. For example, pores 310b may remain filled with the photosensitive material 332 in one embodiment. In another embodiment, the chemical properties of region 304b of the low-k material are altered by the photosensitive material 332 or in the development process of the photosensitive layer 332, or both, so that region 304b functions as a barrier to copper 308 diffusion and oxidation.

Note that the sidewall 312 region of the low-k dielectric 304 may comprise pores 310 that are slightly spaced apart, as shown in FIG. 8, in one embodiment. The barrier region 304b in this embodiment comprises a thickness $d_2$ extending into the sidewalls 312 of the pattern 305, wherein $d_2$ may comprise about 15 Å to 50 Å, as an example. Alternatively, in another embodiment, the sidewall 312 region may comprise pores 310 that are connected so that the photosensitive layer 332 soaks deeper into the sidewalls 312, as shown in FIG. 10. In this embodiment, the photosensitive layer 332 soaks into the sidewalls 312 by a distance $d_2$, so that the barrier region 304b has an increased thickness $d_2$, as shown. The barrier region 304b may comprise a thickness $d_2$ greater than 50 Å in this embodiment, e.g., 75 Å or greater. The thickness of the barrier region 304b is a function of the pore 310 size, the extent to which the pores 310 are connected to adjacent pores 310, and the viscosity of the photosensitive layer 332, as examples.

FIGS. 11, 12a through 12d and 13 show additional preferred embodiments of the present invention. Similar reference numbers are designated for the various elements in these figures as were used in FIGS. 5 through 10. To avoid repetition, each reference number shown in the diagram is not described again in detail herein. Rather, similar materials x02, x04, x05, etc. . . . are preferably used for the material layers shown as were described for FIGS. 5 through 10, where x=3 in FIGS. 5 through 10, x=4 in FIGS. 11, 12a through 12d, and x=5 in FIG. 13. As an example, the preferred and alternative materials listed for porous dielectric material 304 in the description for FIGS. 5 through 10 are preferably also used for the porous dielectric material or low-k material 404 in FIGS. 11, 12a–12d and the porous dielectric material or low-k material 504 in FIG. 13.

Figure 11:
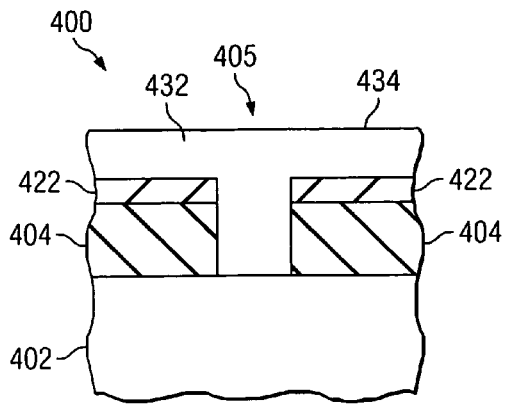
FIGS. 11, and 12a through 12d show embodiments of the present invention wherein an etch stop layer is disposed over the porous dielectric material.

FIG. 11 shows another preferred embodiment of the present invention, wherein an etch stop layer or hard mask layer 422 is deposited or formed over the low-k material 404 before the pattern 405 is formed therein. The etch stop layer 422 preferably comprises a silicon carbon based material, a carbo-nitride material, a spin-on cap material, silicon nitride, silicon oxides, other insulating materials, a metal, or combinations thereof, as examples. The etch stop layer 422 may comprise a thickness of about 100 Å to 1000 Å, for example.

Figure 12A:
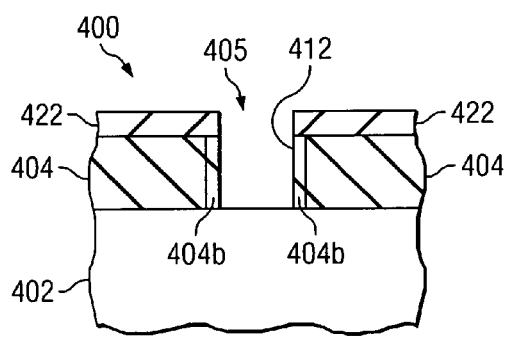

The use of an etch stop layer 422 is advantageous because it ensures that the photosensitive layer 432 in region 404b proximate the sidewalls 412 of the patterns 405 is not developed when the photosensitive layer 432 is developed, as shown in FIG. 12a. For example, light from the flood exposure process is unable to reach areas beneath the etch stop layer 422; thus, the material of the photosensitive layer 432 disposed beneath the etch stop layer 422 is not developed. Note also in this embodiment shown in FIG. 11 that the photosensitive layer 432 may be deposited in a relatively thick layer. For example, the photosensitive layer 432 may completely fill the pattern 405 and may comprise a planar top surface 434, as shown in FIG. 11. Thus, it is not required in accordance with embodiments of the present invention that the photosensitive layer 432 be deposited thinly to ensure that all of the photosensitive layer 432 is removed within the pattern 405.

FIG. 12b illustrates an embodiment of the present invention wherein the pattern 405 comprises features with outwardly sloping sidewalls 412 in a lower part. For example, the pattern 405 is narrower at the top part than at the lower part, as shown. When the photosensitive layer 432 is deposited over the patterned low-k material 404 and etch stop layer 422, exposed and developed, a portion of the photosensitive layer 432 remains disposed over the sidewalls of the low-k material 404 beneath the etch stop layer 422. The photosensitive layer 432 advantageously has straight or substantially vertical sidewalls 440, as shown. In one embodiment, the photosensitive layer 432 does not soak into the sidewalls 412 of the low-k material 404, as shown in FIG. 12b. However, in another embodiment, the photosensitive layer 432 does soak into the sidewalls 412 of the low-k material 404, e.g., at 404b, shown in FIG. 12c.

Figure 12D:
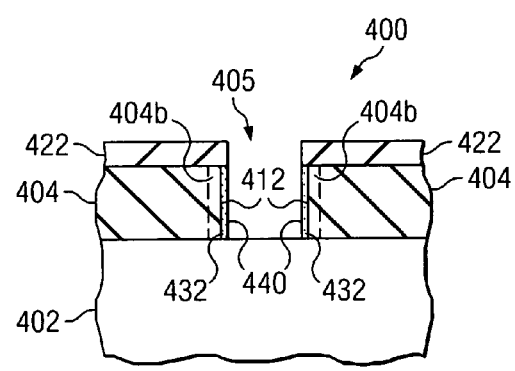
Figure 12B:
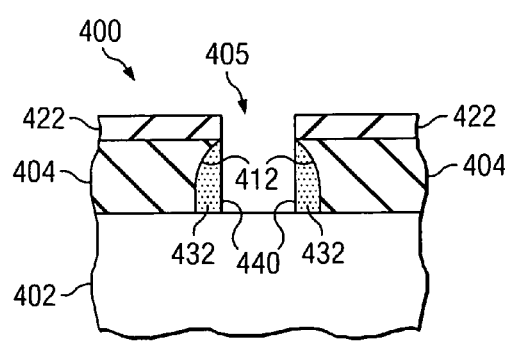

Thus, embodiments of the present invention include a barrier region 404b comprising a photosensitive material 432 soaked into the sidewalls 412 of a low-k material 404, a barrier region comprising a photosensitive material 432 covering the sidewalls 412 of a low-k material 404, or both. Embodiments of the present invention may also be implemented in patterns 405 having substantially vertical sidewalls, as shown in FIG. 12d or wherein the pattern 405 comprises vias with inwardly sloping sidewalls 412 in a lower part (not shown).

Figure 13:
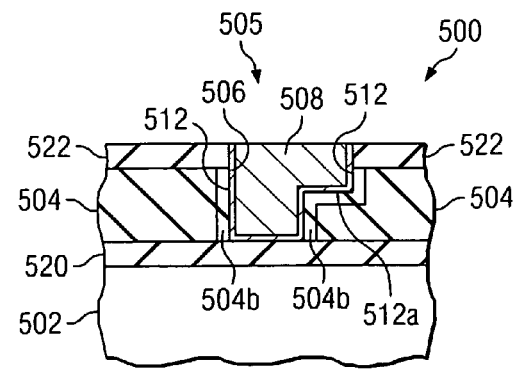
FIG. 13 shows an embodiment of the present invention implemented in a dual damascene structure.

Embodiments of the present invention may be used in single damascene processes, as shown in FIGS. 5 through 11, 12a through 12d, or alternatively, embodiments of the present invention may be used in dual damascene methods and structures, as shown in FIG. 13. Referring now to FIG. 13, a semiconductor device 500 comprises a workpiece 502, and a first etch stop layer 520 is formed over the workpiece

502. A porous dielectric material 504 is deposited over the first etch stop layer 520, and the low-k material 504 is patterned with a dual damascene pattern 505 comprising vias and conductive lines, for example. A photosensitive layer 522 such as is described for semiconductor devices 300 and 400 in FIGS. 5 through 10, and 11, 12*a* through 12*d*, respectively, is deposited over the patterned low-k material 504. The photosensitive layer 522 is developed, leaving barrier regions 504*b* along the sidewalls and top surface of the pattern 505, as shown.

Note that in this embodiment and also in the other embodiments described herein, an optional first etch stop layer 520 and optional second etch stop layer 522 may be formed beneath and above the low-k material 504, as shown. The optional first and second etch stop layers 520 and 522 may comprise about 100 to 1000 Å of a SiC-based material, as an example. The optional etch stop layers 520 and 522 may alternatively comprise silicon nitride, silicon oxide, or metals. The etch stop layers 520 and 522 may also comprise a carbo-nitride material, a spin-on cap material, other insulating materials, or combinations of the materials mentioned herein, as examples.

Advantages of embodiments of the present invention include providing a method of forming a barrier region of sidewalls of damascene structures in porous dielectric materials. The barrier region within the sidewalls prevents copper from diffusing in pinholes that may be formed in a liner deposited prior to filling the patterns with copper. Embodiments of the invention allow the use of a conformal liner that is deposited by ALD or CVD. The method and structure result in fewer device failures and increased yields. Patterns with substantially vertical sidewalls may be manufactured using embodiments of the present invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
    providing a workpiece;
    depositing a porous dielectric material over the workpiece;
    forming a pattern in the porous dielectric material, the pattern comprising sidewalls;
    depositing a layer of photosensitive material over the porous dielectric material that covers the sidewalls of the pattern in the porous dielectric material such that said photosensitive material soaks a first distance into the sidewalls of the pattern in the porous dielectric material;
    providing light having a wavelength selected to develop the photosensitive material;
    developing and removing portions of the photosensitive material exposed to said light; and
    leaving portions of said photosensitive material that soaked into said porous sidewalls unexposed, and undeveloped such that said photosensitive material that soaked in said porourus sidewalls is not removed, and forms a barrier region of photosensitive material within the sidewalls.

2. The method according to claim 1, wherein forming the pattern in the porous dielectric material comprises forming a single or dual damascene pattern.

3. The method according to claim 1, wherein depositing the porous dielectric material comprises depositing a low dielectric constant material.

4. The method according to claim 3, wherein depositing the low dielectric constant material comprises depositing a material having a dielectric constant of 3.0 or less.

5. The method according to claim 3, wherein depositing the low dielectric constant material comprises depositing porous methylsilsesquioxane (MSQ), porous inorganic materials, porous CYD materials, porous organic materials, other non-low-k dielectric materials, or combinations thereof.

6. The method according to claim 1, wherein depositing the photosensitive material comprises spinning on a material compatible with the porous dielectric material.

7. The method according to claim 6, wherein depositing the porous dielectric material comprises depositing porous methylsilsesquioxane (MSQ), a porous inorganic material, a porous CVD material, a porous organic material, or a non-low-k dielectric material, and depositing the photosensitive material comprises depositing a MSQ material, an inorganic material, a CVD material, an organic material, or a non-low-k dielectric material.

8. The method according to claim 1, wherein depositing the photosensitive material comprises depositing photosensitive polyimide, a photosensitive organic material, a photosensitive inorganic material, or benzocyclobutane (BCB).

9. The method according to claim 1, wherein the porous dielectric material comprises a plurality of pores, wherein the barrier region comprises photosensitive material soaked into the sidewalls of the porous dielectric material pattern by about one or two pores.

10. The method according to claim 1, wherein the barrier region comprises photosensitive material soaked into the sidewalls of the porous dielectric material pattern by about 50 Å or less.

11. The method according to claim 1, wherein developing the photosensitive material comprises exposing the workpiece to ultraviolet (UV) light.

12. The method according to claim 11, wherein exposing the workpiece to light comprises exposing the workpiece to DUV light in 365 nm, 248 nm, or 193 nm wavelengths.

13. The method according to claim 1, further comprising:
    depositing a liner over the porous dielectric material and barrier region of photosensitive material; and
    depositing a conductive material over the liner to fill the pattern in the porous dielectric material.

14. The method according to claim 13, wherein depositing the conductive material comprises depositing copper.

15. The method according to claim 1, further comprising depositing an etch stop layer over the porous dielectric material, before forming the pattern in the porous dielectric material.

16. The method according to claim 15, wherein the etch stop layer comprises about 100 to 1000 Å of a silicon carbon based material, a carbo-nitride material, a spin-on cap material, silicon nitride, silicon oxides, other insulating materials, a metal, or combinations thereof.

17. The method of claim 15 wherein said etch stop layer shields a layer of photosensitive material on said sidewalls from said light such that said shielded layer is not developed and is not removed.

18. The method of claim 15 wherein said etch stop layer shields the photosensitive material that soaked into said process sidewalls from said light such that said shielded layer is not developed and is not removed.

* * * * *